United States Patent
Park et al.

(10) Patent No.: US 12,334,184 B2
(45) Date of Patent: Jun. 17, 2025

(54) BUS INVERSION ENCODER MODULE AND BUS INVERSION SYSTEM INCLUDING THE SAME

(71) Applicants: SK hynix Inc., Icheon-si (KR); KOREA UNIVERSITY RESEARCH AND BUSINESS FOUNDATION, Seoul (KR)

(72) Inventors: Jong Sun Park, Seoul (KR); Seong Yoon Kang, Seoul (KR); Jun Il Moon, Icheon-si (KR); Myeong Jae Park, Icheon-si (KR); Byung Kuk Yoon, Icheon-si (KR)

(73) Assignees: SK hynix Inc., Icheon-si (KR); KOREA UNIVERSITY RESEARCH AND BUSINESS FOUNDATION, Seoul (KR)

(*) Notice: Subject to any disclaimer, the term of this patent is extended or adjusted under 35 U.S.C. 154(b) by 155 days.

(21) Appl. No.: 18/318,637

(22) Filed: May 16, 2023

(65) Prior Publication Data
US 2024/0233784 A1 Jul. 11, 2024

(30) Foreign Application Priority Data
Jan. 9, 2023 (KR) .................. 10-2023-0002995

(51) Int. Cl.
*G11C 7/10* (2006.01)
*H03K 19/21* (2006.01)

(52) U.S. Cl.
CPC .......... *G11C 7/1048* (2013.01); *G11C 7/1063* (2013.01); *H03K 19/21* (2013.01)

(58) Field of Classification Search
CPC ................... G11C 7/1048; G11C 7/10
(Continued)

(56) References Cited

U.S. PATENT DOCUMENTS

2014/0355679 A1* 12/2014 Rosewarne .......... H04N 19/176
375/240.12
2017/0102675 A1* 4/2017 Drees ...................... H02S 50/00
(Continued)

FOREIGN PATENT DOCUMENTS

KR 10-0735758 B1 7/2007
KR 10-2014-0139858 A 12/2014

OTHER PUBLICATIONS

An 80 nm 4 GB/s/pin 32 bit 512 Mb GDDR4 Graphics DRAM With Low Power and Low Noise Data Bus Inversion Seung-Jun Bae et al. Fellow, IEEE, and Soo-In Cho IEEE Journal of Solid-State Circuits, vol. 43, No. 1, Jan. 2008.*
(Continued)

*Primary Examiner* — Muna A Techane

(57) ABSTRACT

Disclosed are a bus inversion encoder module that utilizes future data in a data bus including a serializer with minimum latency and high transition reduction efficiency by comparing current data with both past data and the future data and encoding the current data, and a bus inversion system including the same. The bus inversion encoder module uses current data, past data, and future data transmitted through a bus and each including a plurality of bits, determines whether to invert the current data, and generates a current flag and coded current data by using whether to invert, an output flag, and the current data. The output flag is generated by summing the current flag and the coded current data and serially converting the current flag and the coded current data.

10 Claims, 9 Drawing Sheets

(58) Field of Classification Search
USPC .................................................. 365/189.11
See application file for complete search history.

(56) References Cited

U.S. PATENT DOCUMENTS

2020/0267403 A1* 8/2020 Lasserre .............. H04N 19/129
2022/0035758 A1* 2/2022 Hanna .................... G11C 7/109

OTHER PUBLICATIONS

"Bus-Invert Coding for Low-Power I/O" Jlircea R. Stan, Member, IEEE, and Wayne P. Burleson, Member, IEEE EEE Transactions on Very Large Scale Integration (VLSI) Systems, vol. 3, No. 1, Mar. 1995.*

"Bus-Invert Coding for Low-Power I/O" Mircea R. Stan, Member, IEEE, and Wayne P. Burleson, Member, IEEE IEEE Transactions on Very Large Scale Integration (VLSI) Systems, vol. 3, No. I , Mar. 1995.

* cited by examiner

FIG. 8

|  | No DBI | Existing DBI AC | Proposed DBI | Increase Rate |
|---|---|---|---|---|
| Maximum CLK Freq. | - | 1.19 GHz | 2.38 GHz | +100 % |
| Engine Power | - | 1408.6 $\mu W$ | 907.7 $\mu W$ | -35.6 % |
| Total Area | - | 2600.832 $\mu m^2$ | 1435.2 $\mu m^2$ | -45.8 % |
| # of Bus Toggle (Increase Rate) | No DBI | 327K(-18.3%) | 327K(-18.3%) | 0 % |

BUS INVERSION ENCODER MODULE AND BUS INVERSION SYSTEM INCLUDING THE SAME

CROSS-REFERENCE TO RELATED APPLICATION

This application claims priority under 35 U.S.C. § 119 to Korean Patent Application No. 10-2023-0002995 filed on Jan. 9, 2023 in the Korean Intellectual Property Office, which is incorporated herein by reference in its entirety.

BACKGROUND

1. Field

Exemplary embodiments relate to a bus inversion encoder, and particularly, to a bus inversion encoder module that utilizes future data in a data bus including a serializer with minimum latency and high transition reduction efficiency by comparing current data with both past data and the future data and encoding the current data, and a bus inversion system including the same.

2. Discussion of the Related Art

As the number of stacked core dies increases and storage cells are scaled down in order to improve the bandwidth and storage capacity performance of a high bandwidth memory (HBM), disadvantages arise from power consumption increases and heat generated due to miniaturization of a semiconductor process. To address these disadvantages, the use of bus inversion encoding capable of reducing AC power consumed in a data bus may be considered.

FIG. 1 is a diagram illustrating a bus inversion encoding method in the related art.

Referring to FIG. 1, in the bus inversion encoding in the related art, when more than half of a plurality of bits each included in past data and current data are different, the current data is inverted ('encoded current data') so that the number of different data bits is equal to or less than half the total number of bits, thereby reducing power consumption due to data toggle. That is, when the current data is 00011111 and the past data is 00000000, since 5 bits of the total 8 bits are different, the current data is inverted and changed to 11100000, so that only 3 bits are different between the inverted current data and the past data. In such a case, a flag indicating whether the data has been inverted and the inverted current data are combined and transmitted ('transmitted data'). It is assumed that the encoded current data is inverted when the flag ('Flag') is assigned a logic high (1) value.

A decoder decodes the transmitted current data (transmitted data) into the original data by using Flag information indicating whether the data has been inverted.

FIGS. 2A and 2B are a diagram illustrating two examples of a bus inversion system in the related art. FIG. 2A includes an upper example and FIG. 2B includes a lower example.

Referring to the upper example in FIG. 2A, when a serializer circuit 120 is included in a bus inversion encoding circuit 110 in the related art, the latency can be reduced through a parallel operation in majority voters 111 used in parallel, but transition reduction efficiency is low because it is not possible to reduce a sequential transition of a flag.

Referring to the lower example in FIG. 2B, on the other hand, an output flag can be used as an input of an operation in the next majority voter 111 in order to reduce a transition by a flag, but there is a disadvantage that the latency increases significantly due to a serial operation.

The bus inversion encoding circuit 110 illustrated in FIGS. 2A and 2B in the related art has a disadvantage that its area efficiency is low because it is necessary to determine inversion or non-inversion by using the majority voter 111 requiring a considerable area for implementation.

FIG. 3 is a diagram illustrating problems with bus inversion encoding in the related art.

Referring to FIG. 3, when a bus inversion encoding circuit in the related art is digitally implemented, the bus inversion encoding circuit requires a plurality of majority voters 310, each including a plurality of full adders (FA) in a process of determining a flag, causing a disadvantage that an area required for implementation is considerable and the latency occurs as described above.

In order to solve these disadvantages, when applied to a data bus including a serializer mainly used for a high-bandwidth memory, past data of future data is current data, but this causes another disadvantage because additional latency is required in order to encode both the current data and the future data.

SUMMARY

Various embodiments are directed to providing a bus inversion encoder module that utilizes future data in a data bus including a serializer with minimum latency and high transition reduction efficiency by comparing current data with both past data and the future data and encoding the current data.

Various embodiments are directed to providing a bus inversion system including a bus inversion encoder module that utilizes future data in a data bus including a serializer with minimum latency and high transition reduction efficiency by comparing current data with both past data and the future data and encoding the current data.

Technical problems to be addressed in the present disclosure are not limited to the aforementioned technical problems and the other unmentioned technical problems will be clearly understood by those skilled in the art from the following description.

A bus inversion encoder module in accordance with embodiments of the present disclosure may use current data, past data, and future data transmitted through a bus and each current data, past data, and future data including a plurality of bits, determine whether to invert the current data, and generate a current flag, a future flag, and coded current data by using the determination of whether to invert, an output flag, and the current data.

A bus inversion system in accordance with embodiments of the present disclosure may include: a bus inversion encoder module configured to use current data, past data, and future data transmitted through a bus and each current data, past data, and future data including a plurality of bits, to determine whether to invert the current data, and to generate a current flag, a future flag, and coded current data by using the determination whether to invert, an output flag, and the current data; and a serializer circuit configured to generate the output flag and the past data by using the future flag, the future flag, the coded current data, and the future data.

Technical problems to be addressed in the present disclosure are not limited to the aforementioned technical problems, and other unmentioned technical problems will be clearly understood by those skilled in the art from the following description.

A bus inversion encoder and a bus inversion system in accordance with embodiments of the present disclosure described above use a circuit that is simple, consumes little power, and occupies a small consumption area on a chip instead of a majority voter that includes full adders used in the related art, is complicated, consumes a lot of power, and occupies a large area on a chip, thereby providing an advantage of reducing power consumption and minimizing the heat generation problem.

Effects achievable in the invention are not limited to the aforementioned effects and the other unmentioned effects will be clearly understood by those skilled in the art from the following description.

BRIEF DESCRIPTION OF THE DRAWINGS

FIG. 8 is a table comparing a clock frequency, power, a consumption area, and a toggle increase/decrease rate between embodiments of the disclosure and the related art.

DETAILED DESCRIPTION

Figure 1:
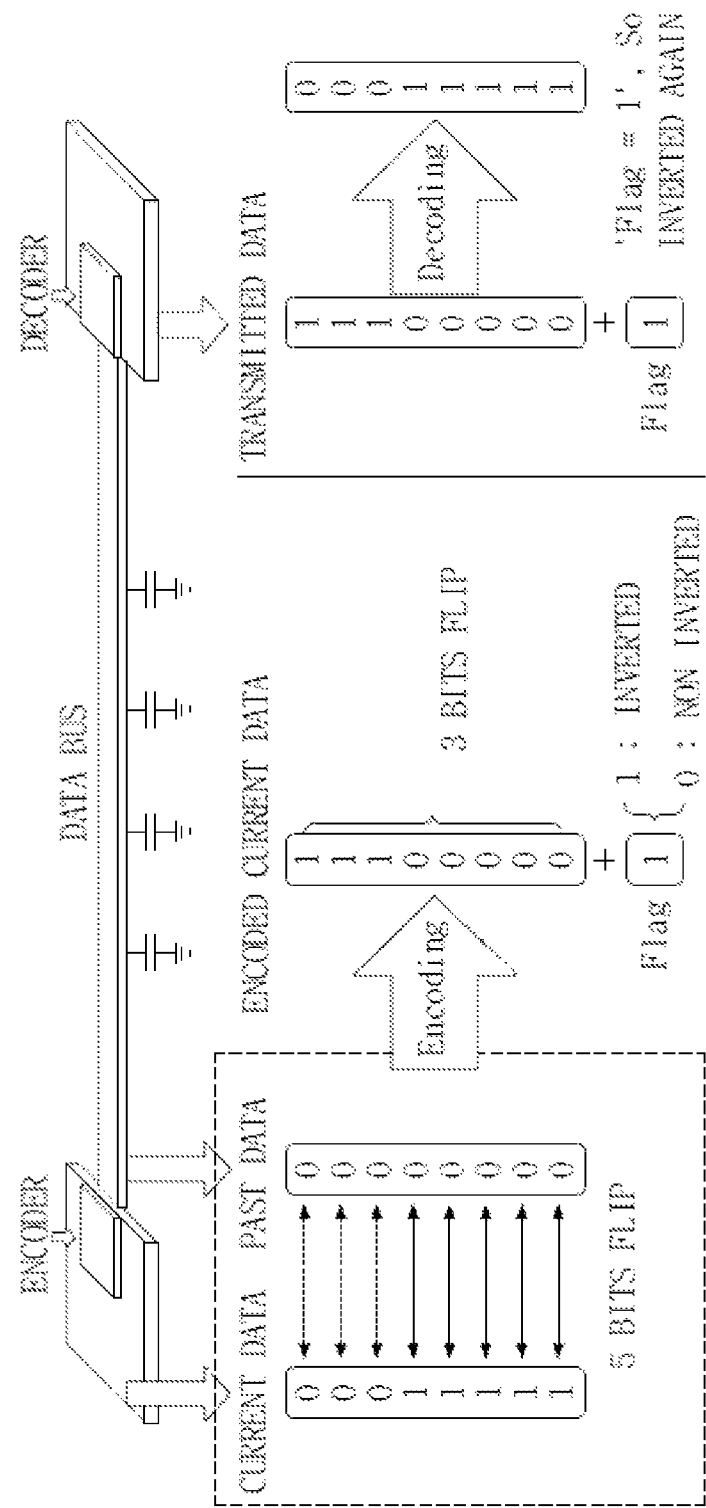
FIG. 1 is a diagram illustrating a bus inversion encoding method in the related art.
Figure 2A:
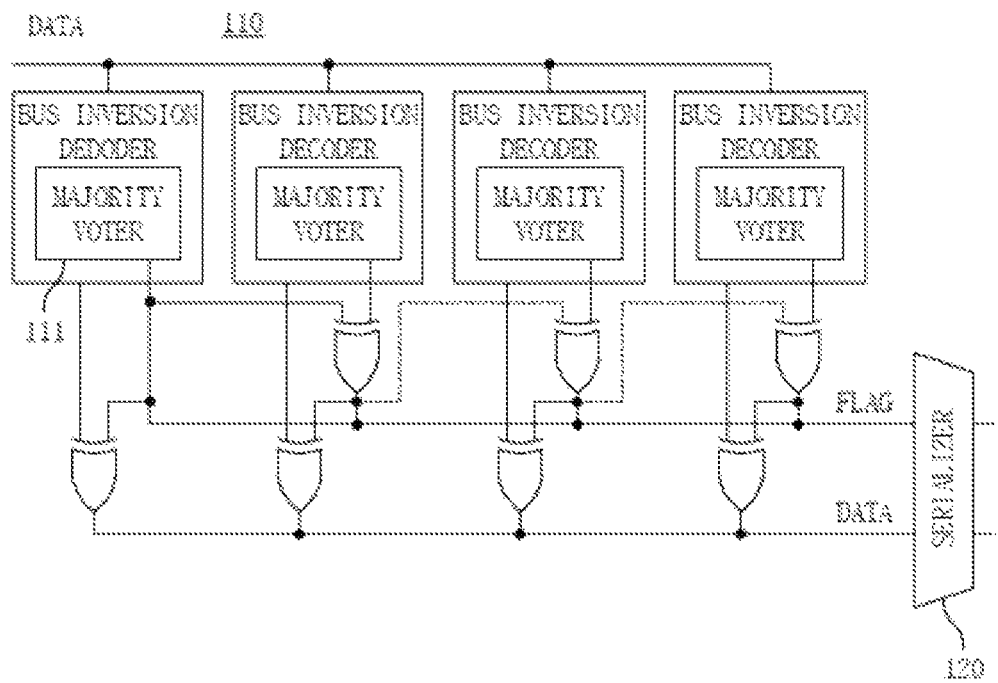
FIGS. 2A and 2B are a diagram illustrating two examples of a bus inversion system in the related art.
Figure 2B:
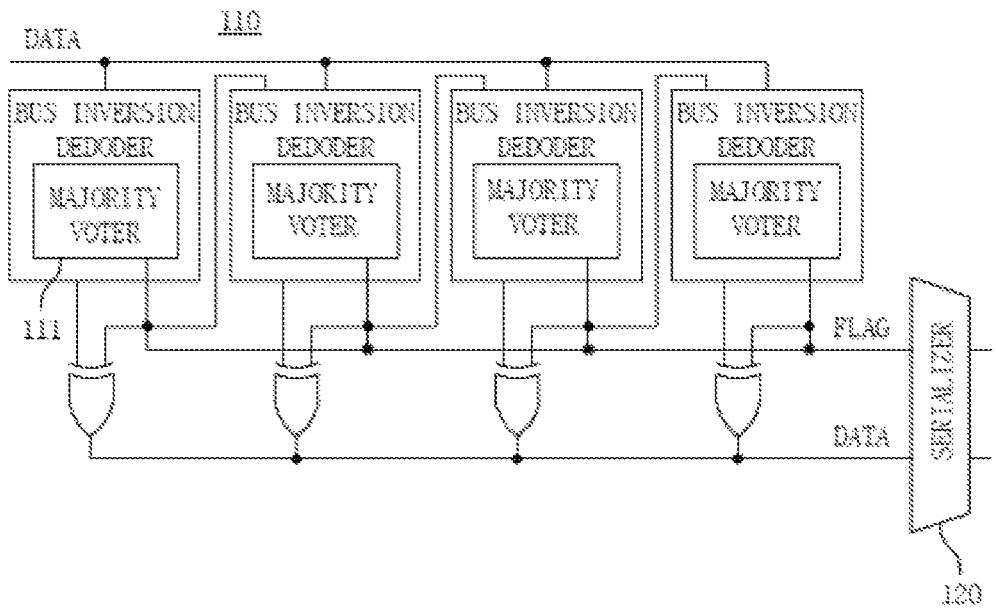
Figure 3:
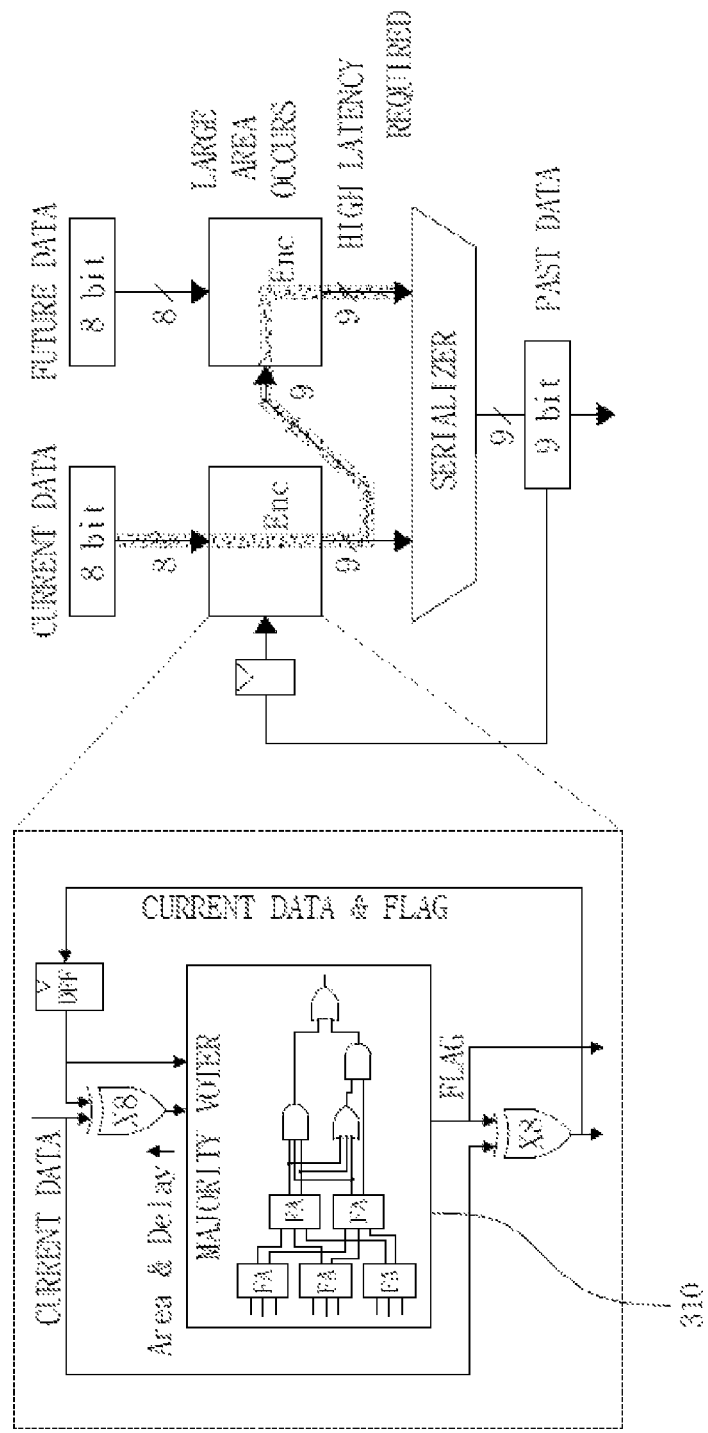
FIG. 3 is a diagram illustrating problems with bus inversion encoding in the related art.

In order to fully understand the present invention, advantages in operation of the present invention, and objects achieved by carrying out the present invention, reference will be made to the accompanying drawings for explaining exemplary examples of the present invention and to the contents described with reference to the accompanying drawings.

Hereinafter, the present invention is described in detail by explaining preferred examples with reference to the accompanying drawings. The same reference numerals in each drawing indicate the same members or elements.

Figure 4:
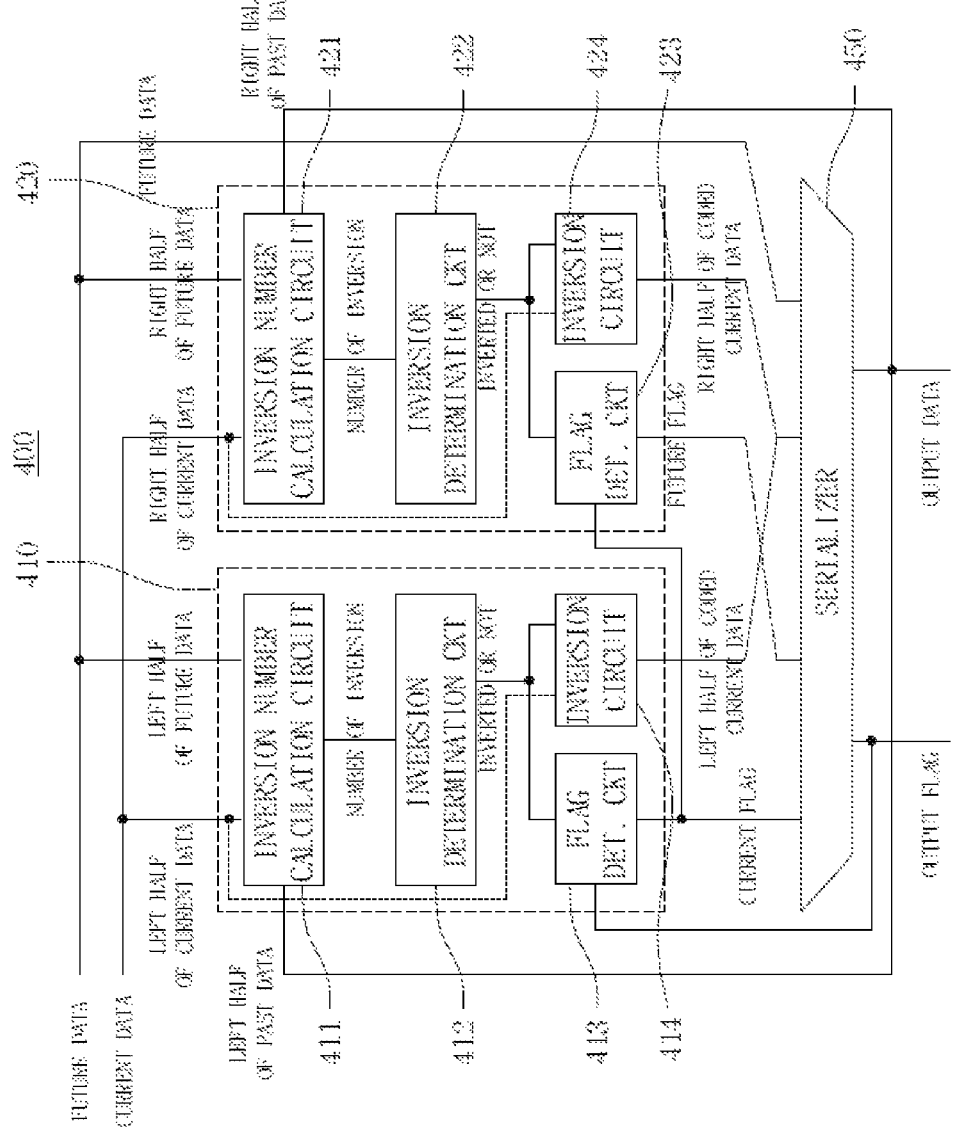
FIG. 4 is a diagram illustrating an example of a bus inversion system using a bus inversion encoder module that utilizes future data in a data bus including a serializer in accordance with an embodiment of the disclosure.

FIG. 4 is a diagram illustrating an example of a bus inversion system using a bus inversion encoder module that utilizes future data in a data bus including a serializer in accordance with an embodiment of the present disclosure.

FIG. 4 illustrates a bus inversion system 400, which uses a bus inversion encoder module including an even number of bus inversion encoders 410 and 420, and a serializer circuit 450. In the bus inversion encoder module, the number of bus inversion encoders 410 will be the same as the number of bus inversion encoders 420. Therefore, the even number of bus inversion encoders 410 and 420 constituting the bus inversion encoder module is continuously expandable by multiples of 2. However, for convenience of description, an example including two bus inversion encoders, one of each of bus inversion encoders 410 and 420, is described.

A first bus inversion encoder 410 includes an inversion number calculation circuit 411, an inversion determination circuit 412, a flag determination circuit 413, and an inversion circuit 414. The bus inversion encoder 410 generates a current flag and half data of coded current data (e.g., left half data of the coded current data) using an output flag, half data of current data (e.g., left half data of the current data), half data of past data (e.g., left half data of the past data), and half data of future data (e.g., left half data of the future data).

A second bus inversion encoder 420 includes an inversion number calculation circuit 421, an inversion determination circuit 422, a flag determination circuit 423, and an inversion circuit 424. The bus inversion encoder 420 generates a future flag and the other half data of the coded current data (e.g., right half data of the coded current data) using the current flag, the other half data of the current data (e.g., right half data of the current data), the other half data of the past data (e.g., right half data of the past data), and the other half data of the future data (e.g., right half data of the future data).

The serializer circuit 450 generates the output flag and output data by using the current flag, the future flag, the half data of the coded current data (e.g., left half data of the coded current data), the other half data of the coded current data (e.g., right half data of the coded current data), and the future data.

Past data means the output data output from the serializer circuit 450. Accordingly, the half data of the past data and the other half data of the past data are also half data of the output data and the other half data of the output data, respectively. Hereinafter, the half data and the other half data can be expressed as left half data and right half data, respectively.

The first bus inversion encoder 410 processes and codes the left half data, and the second bus inversion encoder 420 processes and codes the right half data.

Hereinafter, the first bus inversion encoder 410 that processes the left half data is described.

The inversion number calculation circuit 411, the inversion determination circuit 412, the flag determination circuit 413, and the inversion circuit 414 of the first bus inversion encoder 410 are substantially identical to the inversion number calculation circuit 421, the inversion determination circuit 422, the flag determination circuit 423, and the inversion circuit 424 of the second bus inversion encoder 420, respectively. Therefore, the components 411 to 414 included in the first bus inversion encoder 410 are described and description of the second bus inversion encoder 420 is omitted.

Figure 5:
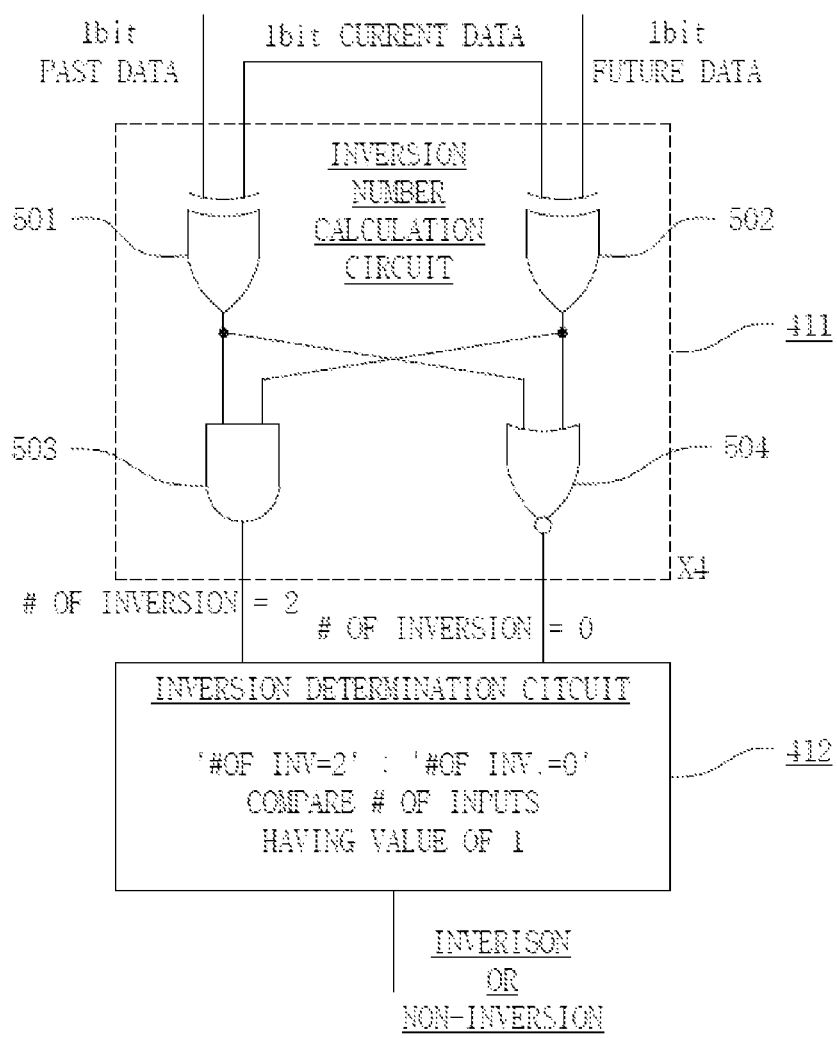
FIG. 5 is a diagram illustrating an example of an inversion number calculation circuit and an inversion determination circuit according to embodiments of the disclosure.

FIG. 5 is a diagram illustrating an example of an inversion number calculation circuit and an inversion determination circuit according to embodiments of the disclosure.

Referring to FIG. 5, an inversion number calculation circuit 411 includes two EX-OR gates 501 and 502, an AND gate 503, and a NOR gate 504.

A first EX-OR gate 501 performs an EX-OR operation (exclusive OR) on the left half data of the past data of 1 bit (1-bit past data) and the left half data of the current data of 1 bit (1-bit current data).

A second EX-OR gate 502 performs an EX-OR operation on the left half data of the current data of 1 bit (1-bit current data) and the left half data of the future data of 1 bit (1-bit future data).

The EX-OR operation (i.e., the exclusive OR operation) is a function of outputting a logic low (0) value when logic values of the two input data are identical to each other and outputting a logic high (1) value when the logic values of the two input data are not identical to each other.

The AND gate 503 performs an AND operation on the operation results of the first EX-OR gate 501 and the second EX-OR gate 502.

The NOR gate 504 inverts a result logic value obtained by performing an OR operation on the operation results of the first EX-OR gate 501 and the second EX-OR gate 502. That is, the NOR gate 504 outputs a logic low (0) value when a logic value of at least one of the two input data is logic high (1) and outputs a logic high (1) value only when both the logic values of the two input data are logic low (0).

Figure 6:
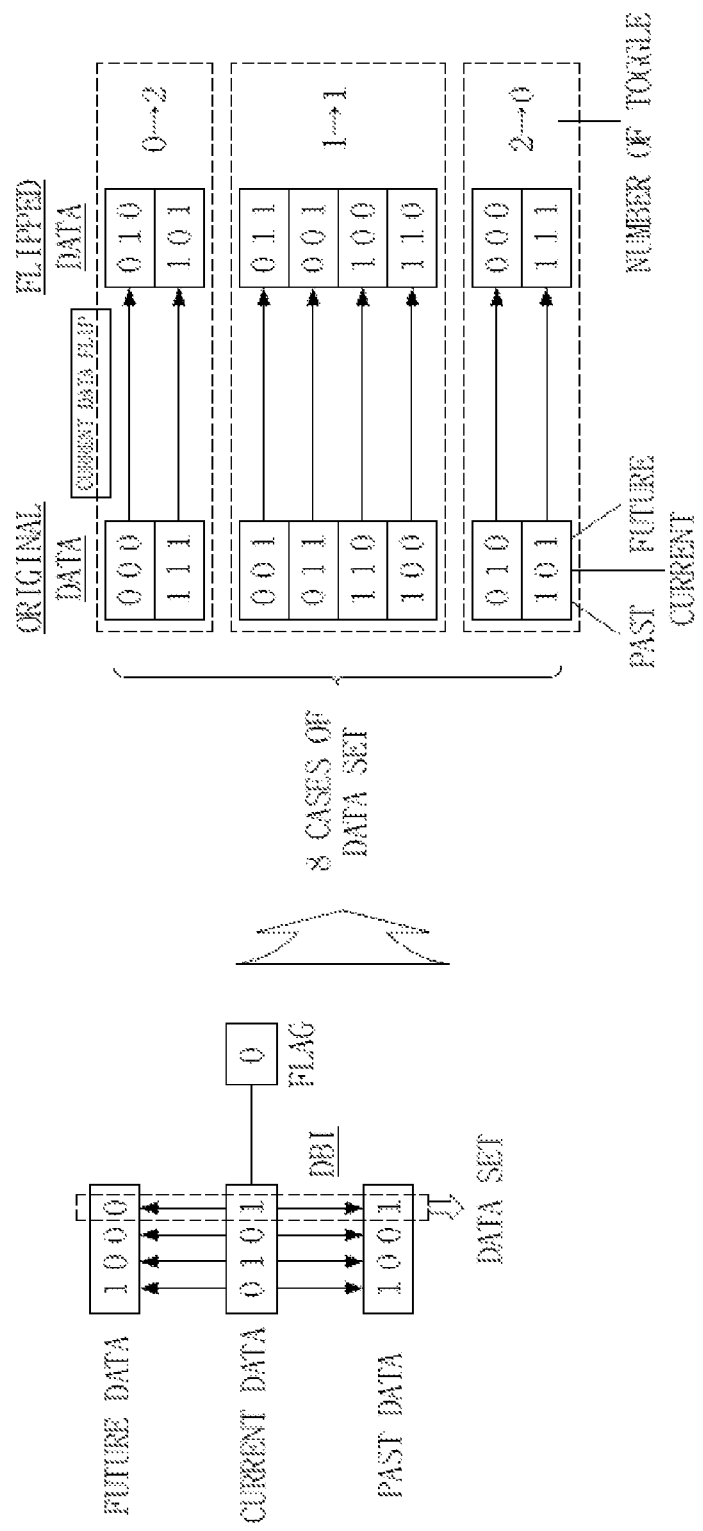
FIG. 6 is a diagram illustrating an operation of an inversion number calculation circuit illustrated in FIG. 5 according to embodiments of the disclosure.

FIG. 6 is a diagram illustrating an operation of an inversion number calculation circuit illustrated in FIG. 5 according to embodiments of the disclosure.

Referring to the left side of FIG. 6, three bits of data form a data set, in which one bit of the past data, one bit of the current data, and one bit of the future data are arranged. As described above, since the left half of the data is 4 bits, there exist 4 data sets in total.

Referring to the right side of FIG. 6, one of the four data sets can be represented by eight cases. The three bits constituting each case are listed in the order of past, current, and future, and when the current data is flipped, that is, when all the current data are inverted, gain or loss is determined in terms of the number of inversions (toggles) when flipping is performed.

In FIG. 6, eight cases are arranged in order from top to bottom. The first and second cases of Original Data are 000 and 111, respectively. Each of the three bits in both first and second case represent, from left to right, past, current, and future data, respectively. Since the values of the three bits are identical to one another, there are no inversions (toggles) among the three bits. Therefore, when the logic value of the current data located in the middle of the three bits is changed (Flipped Data), it can be seen that two inversions occur because the past data and the current data are inverted, and the current data and the future data are inverted. That is, in each case with three bits 000 or 111, the number of inversions is increased from 0 to 2 when the logic value of the current data is changed.

Next, the third to sixth cases of Original Data are 001, 011, 110, and 100 are listed, and each of these cases is inverted once, namely, one inversion occurs even when the logic value of the current data located in the middle of the three bits is changed in the Flipped Data. That is, in each case with three bits 001, 011, 110, or 100, the number of inversions is not changed even though the logic value of the current data is changed.

Finally, the seventh and eighth cases of Original Data are listed as 010 and 101, and each of these cases is inverted twice. Therefore, when the logic value of the current data located in the middle of the three bits is changed in the Flipped Data, the number of inversions is zero. That is, in each case with three bits 010 or 101, it can be seen that the number of inversions is decreased from 2 to 0 when the logic value of the current data is changed.

Referring to FIG. 5, it can be seen that the inversion number calculation circuit 411 determines whether the number of inversions is 0 or 2 when the current data bit is changed, the output of the AND gate 503 is activated when it is determined that the number of inversions is 2 and the output of the NOR gate 504 is activated when it is determined that the number of inversions is 0. It is assumed that the being activated indicates that the output of the AND gate 503 and the output of the NOR gate 504 each have a logic high value.

Referring to FIG. 6, it can be seen that when the continuous data of the past, current, and future are 000 and 111, flipping the current data is a loss. When the continuous data are 010 and 101, flipping the current data is a gain, and when the continuous data are 001, 011, 110, and 100, flipping the current data is neither a loss nor a gain.

The present disclosure relates to a technology for minimizing the number of inversions of data of a data set during encoding for each case of the data set having three bits 001, 011, 110, and 100, where the number of inversions is not changed even though the logical value of current data is changed. Embodiments of the disclosure do not affect hardware and flag determination, which do not need to be taken into consideration.

Since the four cases 001, 011, 110, and 100 do not need to be implemented in hardware, one of the advantages of embodiments of the disclosure is that the bus inversion system can be implemented with a simple circuit, instead of a majority voter used in the related art.

Referring now back to FIG. 5, the inversion determination circuit 412 generates and outputs an inversion signal instructing whether to invert the current data from the logic values of the outputs of the AND gate 503 and the NOR gate 504 included in the inversion number calculation circuit 411. A detailed description of the inversion determination circuit 412 performing the above function is omitted as such circuits may be implemented in hardware of in a signal processing device by a person skilled in the art.

Assuming that the number of data to be processed is 8 bits, the left half data of the data is 4 bits. In such a case, the number of inversion number calculation circuits 411 illustrated in FIG. 5, which needs to be installed, is four (×4).

Accordingly, each of the inversion determination circuit 412 compares the numbers of activations of the outputs of the AND gate 503 and the NOR gate 504 included in the four inversion number calculation circuits 411, and determines a 1-bit inversion signal. For example, assuming that the 1-bit inversion signal is an instruction to invert current data when logic is high, it may be assumed that the 1-bit inversion signal is an instruction not to invert current data when logic is low.

The number information collected from the four inversion number calculation circuits 411 includes the number of times by which it is determined that the number of inversions is increased from 0 to 2. The number of times by which the output of the AND gate 503 is activated is compared with the number of times by which it is determined that the number of inversions is decreased from 2 to 0, that is, the number of times by which the output of the NOR gate 504 is activated. The decision as to whether to invert the current data is preferably determined in a direction in which the number of inversions decreases. The inversion signal includes information on whether the current data is inverted.

The inversion signal (whether to invert) output from the inversion determination circuit 412 is used in the flag determination circuit 413 and the inversion circuit 414 to be described below.

Figure 7:
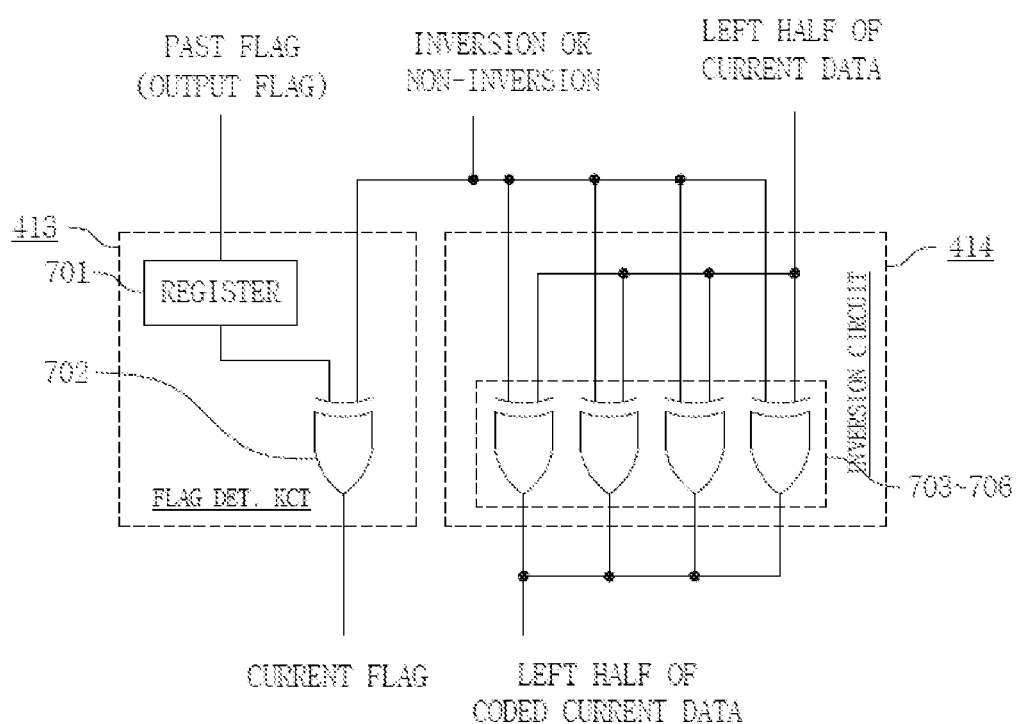
FIG. 7 is a diagram illustrating an example of a flag determination circuit and an inversion circuit according to embodiments of the disclosure.

FIG. 7 is a diagram illustrating an example of a flag determination circuit and an inversion circuit according to embodiments of the disclosure.

Referring to FIG. 7, a flag determination circuit 413 includes a register 701 and a third EX-OR gate 702.

The register 701 stores a past flag, that is, an output flag of a serializer circuit 450. The third EX-OR gate 702 generates a current flag by performing an exclusive OR operation on the logic value of the past flag of 1 bit stored in the register 701 and the logic value of the 1-bit inversion signal (whether to invert) output from an inversion determination circuit 412.

Referring to FIG. 7, the inversion circuit 414 includes four EX-OR gates 703 to 706, and generates the left half data of the coded current data by performing an exclusive OR operation on the inversion signal and the half data of the current data.

A fourth EX-OR gate 703 generates one bit of the left half data of the coded current data by performing an exclusive OR operation on the inversion signal and one bit of the half data of the current data.

A fifth EX-OR gate 704 to a seventh EX-OR gate 706 generate the other three bits of the left half data of the coded current data by performing an exclusive OR operation on the inversion signal and the other one bit of the half data of the current data.

FIG. 8 is a table comparing a clock frequency, power, a consumption area, and a toggle increase/decrease rate between embodiments of the disclosure and the related art.

Referring to FIG. 8, the maximum clock frequency of an existing data bus inversion (DBI) AC is 1.19 GHz, whereas the maximum clock frequency of the DBI of embodiments of the disclosure can be increased by about two times to 2.38 GHz.

The power consumption of an existing DBIAC is 1408.6 μW, whereas the DBI of embodiments of the disclosure is reduced by about 35% to 907.7 μW. The implementation area of the DBI in accordance with embodiments of the disclosure is reduced by 45.8% compared to the implementation area of the existing DBIAC, and there is no difference in the toggle ratio of the bus between the related art and embodiments of the disclosure.

Figure 9:
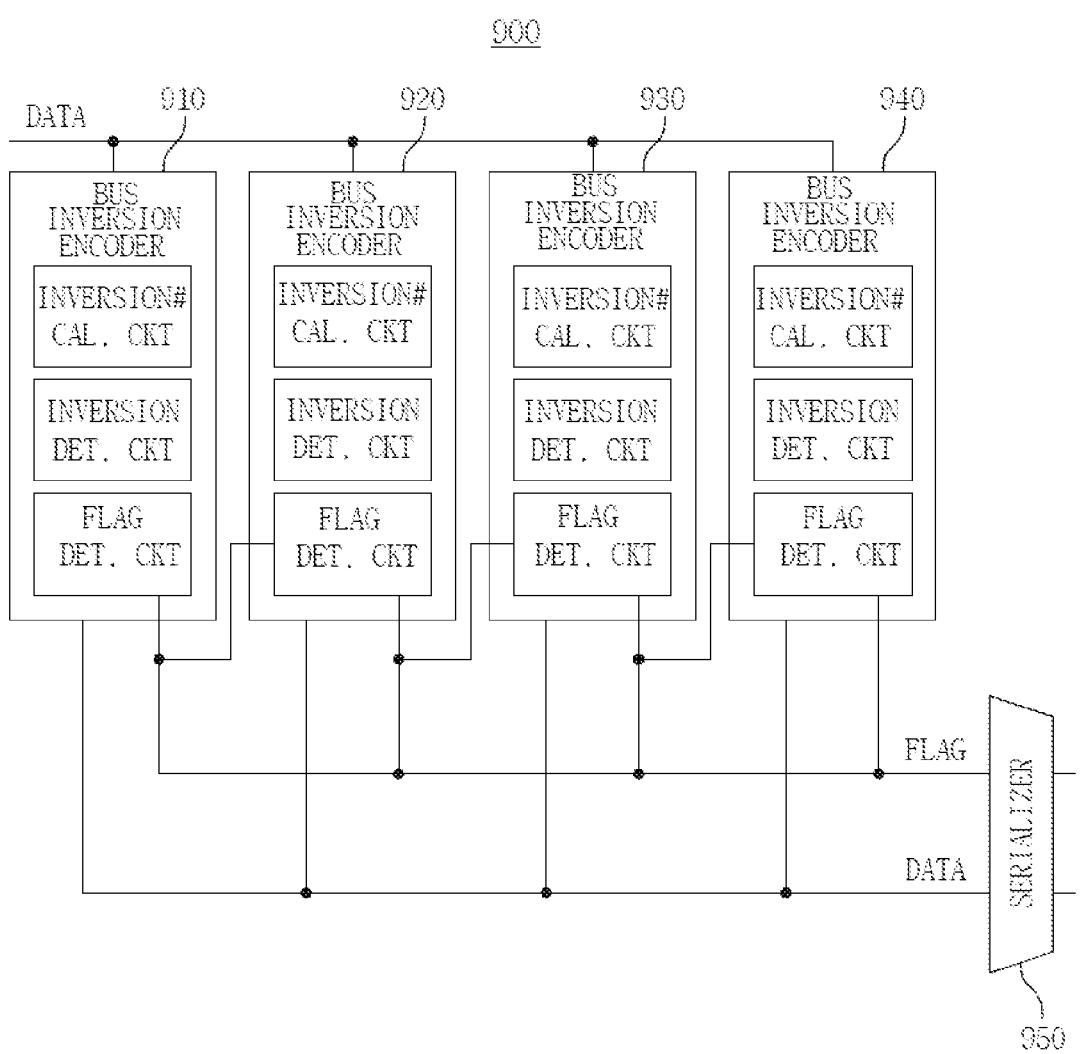
FIG. 9 is a diagram illustrating another example of a bus inversion system in accordance with embodiments of the disclosure.

FIG. 9 is a diagram illustrating another example of a bus inversion system in accordance with embodiments of the disclosure.

A bus inversion system 400 illustrated in FIG. 4 uses two bus inversion encoders 410 and 420, whereas A bus inversion system 900 illustrated in FIG. 9 uses four bus inversion encoders 910, 920, 930, and 940. As illustrated in FIG. 9, the bus inversion encoder can be expanded by a multiple of 2.

Although the technical spirit of the present invention has been described together with the accompanying drawings, embodiments of the disclosure are illustrative examples of the present invention and do not limit the present invention. In addition, it is clear that various modifications and limitations can be made by anyone skilled in the art to which the present invention belongs without departing from the scope of the technical spirit of the present invention.

What is claimed is:

1. A bus inversion encoder module configured to use current data, past data, and future data transmitted through a bus and each current data, past data, and future data including a plurality of bits, to determine whether to invert the current data, and
to generate a current flag, a future flag, and coded current data by using the determination whether to invert the current data, an output flag, and the current data.

2. The bus inversion encoder module of claim 1, wherein the bus inversion encoder module comprises:
a first bus inversion encoder configured to
determine whether to invert half data of the current data by using the half data of the current data, half data of the future data, and half data of the past data, and
generate the current flag and half data of the coded current data by using the half data of the current data, the inversion of the half data of the current data, and the output flag; and
a second bus inversion encoder configured to
determine whether to invert the other half data of the current data by using the other half data of the current data, the other half data of the future data, and the other half data of the past data, and
generate the future flag and the other half data of the coded current data by using the other half data of the current data, the inversion of the other half data of the current data, and the current flag.

3. The bus inversion encoder module of claim 2, wherein the first bus inversion encoder comprises:
a plurality of first inversion number calculation circuits configured to calculate and output the number of data inversions when the half data of the current data is flipped using one bit of each of a plurality of bits each constituting the half data of the past data, the half data of the current data, and the half data of the future data;
a first inversion determination circuit configured to collect a plurality of the numbers of inversions and generate an inversion signal for determining whether to invert the half data of the current data;
a first flag determination circuit configured to generate the current flag by using the inversion signal for the half data of the current data and the output flag; and
a first inversion circuit configured to generate the half data of the coded current data by coding the half data of the current data and the inversion signal for the half data of the current data, and
wherein the second bus inversion encoder comprises:
a plurality of second inversion number calculation circuits configured to calculate and output the number of data inversions when the other half data of the current data is flipped using one bit of each of a plurality of bits each constituting the other half data of the past data, the other half data of the current data, and the other half data of the future data;
a second inversion determination circuit configured to collect a plurality of the numbers of inversions and generate an inversion signal for determining whether to invert the other half data of the current data;
a second flag determination circuit configured to generate the future flag by using the inversion signal for the other half data of the current data and the current flag; and
a second inversion circuit configured to generate the other half data of the coded current data by coding the other half data of the current data and the inversion signal for the other half data of the current data.

4. The bus inversion encoder module of claim 3, wherein each of the plurality of first inversion number calculation circuits and the plurality of second inversion number calculation circuits comprises:
a first EX-OR gate configured to perform an exclusive OR operation on one bit of a plurality of bits each constituting the past data and the current data;
a second EX-OR gate configured to perform an exclusive OR operation on one bit of a plurality of bits each constituting the current data and the future data;
an AND gate configured to perform an AND operation on operation results of the first EX-OR gate and the second EX-OR gate; and a NOR gate configured to invert a result obtained by performing an OR operation on the operation results of the first EX-OR gate and the second EX-OR gate.

5. The bus inversion encoder module of claim 3, wherein the first flag determination circuit comprises:
 a first register configured to store the future flag or the output flag; and
 a 3-1th EX-OR gate configured to generate the current flag by performing an exclusive OR operation on the future flag or a logic value of the output flag of 1 bit stored in the first register and the inversion signal of 1 bit, and
the second flag determination circuit comprises:
 a second register configured to store the current flag; and
 a 3-2th EX-OR gate configured to generate the future flag by performing an exclusive OR operation on a logic value of the current flag of 1 bit stored in the second register and the inversion signal of 1 bit.

6. The bus inversion encoder module of claim 3, wherein each of the first inversion circuit and the second inversion circuit comprises:
 a plurality of EX-OR gates configured to generate the coded current data by performing an exclusive OR operation on the inversion signal for the half data of the current data or the inversion signal for the other half data of the current data and a plurality of bits each included in the half data of the current data or the other half data of the current data.

7. A bus inversion system comprising:
 a bus inversion encoder module configured to use current data, past data, and future data transmitted through a bus and each current data, past data, and future data including a plurality of bits, to determine whether to invert the current data, and to generate a current flag, a future flag, and coded current data by using the determination whether to invert the current data, an output flag, and the current data; and
 a serializer circuit configured to generate the output flag and the past data by using the current flag, the future flag, the coded current data, and the future data.

8. The bus inversion system of claim 7, wherein the bus inversion encoder module comprises:
 a first bus inversion encoder; and
 a second bus inversion encoder,
 wherein the past data, the current data, and the future data each including a plurality of bits are each divided into half data and the other half data,
 the first bus inversion encoder is configured to perform encoding on the half data of the past data, the half data of the current data, and the half data of the future data, thereby generating the current flag and half data of the coded current data, and
 the second bus inversion encoder is configured to perform encoding on the other half data of the past data, the other half data of the current data, and the other half data of the future data, thereby generating the future flag and the other half data of the coded current data.

9. The bus inversion system of claim 8, wherein the first bus inversion encoder comprises:
 a plurality of first inversion number calculation circuits configured to calculate and output the number of data inversions when the half data of the current data is flipped using one bit of each of a plurality of bits each constituting the half data of the past data, the half data of the current data, and the half data of the future data;
 a first inversion determination circuit configured to collect a plurality of the numbers of inversions and generate an inversion signal for determining whether to invert the half data of the current data;
 a first flag determination circuit configured to generate the current flag by using the inversion signal for the half data of the current data and the output flag; and
 a first inversion circuit configured to generate the half data of the coded current data by coding the half data of the current data and the inversion signal for the half data of the current data.

10. The bus inversion system of claim 9, wherein the second bus inversion encoder comprises:
 a plurality of second inversion number calculation circuits configured to calculate and output the number of data inversions when the other half data of the current data is flipped using one bit of each of a plurality of bits each constituting the other half data of the past data, the other half data of the current data, and the other half data of the future data;
 a second inversion determination circuit configured to collect a plurality of the numbers of inversions and generate an inversion signal for determining whether to invert the other half data of the current data;
 a second flag determination circuit configured to generate the future flag by using the inversion signal for the other half data of the current data and the current flag; and
 a second inversion circuit configured to generate the other half data of the coded current data by coding the other half data of the current data and the inversion signal for the other half data of the current data.

* * * * *